US010968348B2

(12) United States Patent
Liu et al.

(10) Patent No.: US 10,968,348 B2
(45) Date of Patent: Apr. 6, 2021

(54) LASER-RELEASABLE BONDING MATERIALS FOR 3-D IC APPLICATIONS

(71) Applicant: Brewer Science, Inc., Rolla, MO (US)

(72) Inventors: Xiao Liu, Rolla, MO (US); Qi Wu, Rolla, MO (US); Rama Puligadda, Rolla, MO (US); Dongshun Bai, Rolla, MO (US); Baron Huang, Taipei (TW)

(73) Assignee: Brewer Science, Inc., Rolla, MO (US)

( * ) Notice: Subject to any disclaimer, the term of this patent is extended or adjusted under 35 U.S.C. 154(b) by 0 days.

(21) Appl. No.: 16/229,591

(22) Filed: Dec. 21, 2018

(65) Prior Publication Data

US 2019/0194453 A1 Jun. 27, 2019

Related U.S. Application Data

(60) Provisional application No. 62/609,426, filed on Dec. 22, 2017.

(51) Int. Cl.
*C08L 71/12* (2006.01)
*H01L 23/00* (2006.01)
(Continued)

(52) U.S. Cl.
CPC ............... *C08L 71/12* (2013.01); *C08K 3/00* (2013.01); *H01L 21/4846* (2013.01);
(Continued)

(58) Field of Classification Search
CPC ....... H01L 23/00; H01L 23/32; H01L 23/528; H01L 21/48; H01L 21/683; H01L 24/83; H01L 24/81; H01L 24/17; H01L 24/27; H01L 24/32; H01L 23/3114; H01L 24/73; H01L 21/4846; H01L 21/6835; H01L 21/4857; H01L 2224/0231; H01L 2224/02333; H01L 2224/02379; H01L 23/3121; H01L 2924/15313; H01L 2224/97; H01L 2224/131; H01L 2224/81005; H01L 2924/10253; H01L 2924/10329; H01L 2924/28262; H01L 2221/68359; H01L 2924/1033; H01L 2924/13; H01L 2924/14; H01L 2924/1461;
(Continued)

(56) References Cited

U.S. PATENT DOCUMENTS 5,989,700 A * 11/1999 Krivopal ................... G01L 1/20
 428/323
8,859,672 B2 * 10/2014 Peters .................... C08G 65/48
 524/505

(Continued)

OTHER PUBLICATIONS

International Search Report and Written Opinion dated Apr. 19, 2019 in corresponding PCT/US2018/067099 filed Dec. 21, 2018.

*Primary Examiner* — Alexander O Williams
(74) *Attorney, Agent, or Firm* — Hovey Williams LLP (57) ABSTRACT

Novel thermoplastic polyhydroxyether-based compositions for use as a laser-releasable composition for temporary bonding and laser debonding processes are provided. The inventive compositions can be debonded using various UV lasers, leaving behind little to no debris. The layers formed from these compositions possess good thermal stabilities and are soluble in commonly-used organic solvents (e.g., cyclopentanone). The compositions can also be used as build-up layers for RDL formation.

31 Claims, 7 Drawing Sheets

(51) Int. Cl.
    *H01L 23/31*       (2006.01)
    *H01L 23/528*      (2006.01)
    *H01L 21/48*       (2006.01)
    *C08K 3/00*        (2018.01)
    *H01L 21/683*      (2006.01)

(52) U.S. Cl.
    CPC ...... *H01L 21/4857* (2013.01); *H01L 21/6835* (2013.01); *H01L 23/3114* (2013.01); *H01L 23/528* (2013.01); *H01L 24/17* (2013.01); *H01L 24/27* (2013.01); *H01L 24/32* (2013.01); *H01L 24/73* (2013.01); *H01L 24/81* (2013.01); *H01L 24/83* (2013.01); *C08L 2203/20* (2013.01); *H01L 23/3121* (2013.01); *H01L 24/13* (2013.01); *H01L 24/16* (2013.01); *H01L 2221/68359* (2013.01); *H01L 2221/68381* (2013.01); *H01L 2224/0231* (2013.01); *H01L 2224/02333* (2013.01); *H01L 2224/02379* (2013.01); *H01L 2224/131* (2013.01); *H01L 2224/16227* (2013.01); *H01L 2224/81005* (2013.01); *H01L 2224/97* (2013.01); *H01L 2924/1033* (2013.01); *H01L 2924/10253* (2013.01); *H01L 2924/10271* (2013.01); *H01L 2924/10329* (2013.01); *H01L 2924/14* (2013.01); *H01L 2924/1461* (2013.01); *H01L 2924/15313* (2013.01); *H01L 2924/18161* (2013.01)

(58) Field of Classification Search
    CPC .................. H01L 24/16; H01L 24/13; H01L 2924/10271; H01L 2224/10271; H01L 2224/68381; H01L 2924/014; H01L 2924/00014; H01L 2224/81; C08K 3/00; C08L 71/02
    USPC .......................................................... 257/750
    See application file for complete search history.

(56) References Cited

U.S. PATENT DOCUMENTS

| | | | |
|---|---|---|---|
| 9,827,740 | B2 | 11/2017 | Liu et al. |
| 10,217,637 | B1* | 2/2019 | Budd ...................... B24B 7/228 |
| 10,304,720 | B2 | 5/2019 | Matos-Perez et al. |
| 2006/0216504 | A1* | 9/2006 | Sutter ...................... D01D 5/08 |
| | | | 428/364 |
| 2009/0218560 | A1 | 9/2009 | Flaim et al. |
| 2013/0288058 | A1 | 10/2013 | Hong et al. |
| 2014/0130969 | A1 | 5/2014 | McCutcheon et al. |
| 2015/0115456 | A1 | 4/2015 | Scanlan |
| 2015/0194331 | A1* | 7/2015 | Bai ........................ B32B 27/08 |
| | | | 257/783 |
| 2016/0133499 | A1 | 5/2016 | Allen et al. |
| 2016/0284582 | A1* | 9/2016 | Dang ...................... C08L 63/00 |
| 2017/0040200 | A1* | 2/2017 | Bai ........................ C08G 77/26 |
| 2018/0063963 | A1 | 3/2018 | Flaim |
| 2019/0134926 | A1* | 5/2019 | Aerts ...................... C08J 5/042 |

* cited by examiner

LASER-RELEASABLE BONDING MATERIALS FOR 3-D IC APPLICATIONS

RELATED APPLICATIONS

The present application claims the priority benefit of U.S. Provisional Patent Application Ser. No. 62/609,426, filed Dec. 22, 2017, entitled LASER-RELASEABLE BONDING MATERIALS FOR 3-D IC APPLICATIONS, incorporated by reference in its entirety herein.

BACKGROUND OF THE INVENTION

Field of the Invention

The present invention relates to laser-releasable compositions for use as bonding compositions in temporary wafer bonding processes or for use as a build-up layer in during redistribution layer formation.

Description of Related Art

Temporary wafer bonding (TWB) normally refers to a process for attaching a device wafer or microelectronic substrate to a carrier wafer or substrate by means of a polymeric bonding material. After bonding, the device wafer is thinned typically to less than 50 µm and then processed to create through-silicon vias (TSV), redistribution layers, bond pads, and other circuit features on its backside. The carrier wafer supports the fragile device wafer during the backside processing, which can entail repeated cycling between ambient temperature and high temperature (>250° C.), mechanical shocks from wafer handling and transfer steps, and strong mechanical forces, such as those imposed during wafer back-grinding processes used to thin the device wafer. When all of this processing has been completed, the device wafer is usually attached to a film frame and then separated, or debonded, from the carrier wafer and cleaned before further operations take place.

Most TWB processes use either one or two layers between the device wafer and the carrier wafer. In the case of a two-layer system, the first layer is a polymeric bonding material. It can be thermoplastic, thermosetting, or photo-curing in nature. The polymeric bonding material layer is typically 10-120 µm thick and, more commonly, about 50-100 µm thick. The second layer is comparatively thin, typically less than 2 µm, and is present to enable facile separation of the bonded wafer pair after processing. The thin layer responds to radiation from a laser or other light source, which leads to decomposition of the layer itself or decomposition of the adjacent polymeric bonding material, causing bonding integrity to be lost within the structure and allowing it to come apart without applying mechanical force.

Currently, most of the temporary bonding/debonding platforms in market focus on multiple-layer structures, such as dual-layer systems that include a temporary bonding layer and a releasing layer. Multiple steps of coating and baking of each layer lead to increased cost of ownership as well as decreased throughput of the whole process. In contrast, a significant reduction of cost and improvement of throughput can be achieved by using a single material that functions as both a temporary bonding layer and laser release layer.

Laser-induced release is becoming a popular mode of debonding and materials are available for operating at laser wavelengths ranging from the ultraviolet (e.g., 248 nm, 308 nm and 355 nm) to the near infrared (e.g., 1064 nm). Laser release technology provides high throughput and low stress during the release process, effective thin-substrate handling, and ease of application, even with large panels. Laser release technology that can be utilized in different applications in packaging areas such as temporary bonding, fan-out wafer-level packaging, lamination, 2.5D/3D integration using through-silicon vias (TSVs), system-in-packaging (SiP), package-on-package (PoP), and other heterogeneous integration infrastructures.

SUMMARY OF THE INVENTION

The present invention is broadly concerned with temporary bonding methods, redistribution layer formation methods, and structures formed by those methods. In one embodiment, a temporary bonding method comprises providing a stack comprising a first substrate, a bonding layer, and a second substrate. The first substrate has a back surface and a front surface. The bonding layer is adjacent the front surface and comprises a polyhydroxyether. The second substrate has a first surface adjacent the bonding layer. The bonding layer is exposed to laser energy so as to facilitate separation of the first and second substrates.

In a further embodiment, the invention provides a microelectronic structure comprising a first substrate having a back surface and a front surface. A bonding layer is adjacent the front surface, with the bonding layer comprising a polyhydroxyether. A second substrate having a first surface is adjacent the bonding layer, and at least one of the front surface and the first surface is a device surface.

In another embodiment, the inventive method comprises forming a build-up layer on the surface of a substrate. The build-up layer comprises a polyhydroxyether and has an upper surface that is remote from the surface of the substrate. A first redistribution layer is formed on the upper surface and optionally one or more additional redistribution layers is formed on the first redistribution layer.

In yet a further embodiment, a microelectronic structure comprises a substrate having a surface. A build-up layer is on the substrate surface, and the build-up layer comprises a polyhydroxyether and has an upper surface that is remote from the substrate surface. There is a first redistribution layer on the upper surface.

DETAILED DESCRIPTION

The present invention is concerned with novel compositions for use as temporary bonding or build-up compositions as well as methods of using those compositions.

Temporary Bonding or Build-Up Polymers and Compositions

1. Polyhydroxyethers

The compositions for use in the present invention comprise polyhydroxyethers. Preferred polyhydroxyethers can be polymeric or oligomeric, with the preferred recurring units including a dihydroxy-containing dye and a diglycidyl ether.

Preferred dihydroxy-containing dyes comprise one or more aromatic moieties with two hydroxy (—OH) groups present on the dye. The dyes or chromophores should absorb light at wavelengths of from about 300 nm to about 400 nm, thus imparting light absorbance properties onto the polyhydroxyethers. Preferred such dyes include those selected from the group consisting of 4,4'-dihydroxybenzophenone, dihydroxy chalcone dyes, 4-[(2-phenylhydrazono)methyl]resorcinol, dihydroxyazobenzene, dihydroxyanthraquinone, 2,2'-methylenebis[6-(benzotriazol-2-yl)-4-tert-octylphenol], curcumin, curcumin derivatives, and combinations thereof.

Preferred diglycidyl ethers comprise cyclic (preferably $C_3$ to $C_8$), aromatic (preferably $C_6$ to $C_{12}$), or aliphatic (preferably $C_2$ to $C_{10}$) moieties with two epoxide rings, typically with the epoxides being connected to an oxygen atom that is bonded with the cyclic or aromatic portion. The preferred diglycidyl ethers include those selected from the group consisting of bisphenol A diglycidyl ether, bisphenol F diglycidyl ether, 1,4-cyclohexanedimethanol diglycidyl ether, resorcinol diglycidyl ether, bisphenol A propoxylate diglycidyl ether, ethylene glycol diglycidyl ether, 1,4-cyclohexandimethanol diglycidyl ether, glycerol diglycidyl ether, 1,4-butanediol diglycidyl ether, neopentyl glycol diglycidyl ether, 1,3-butanediol diglycidyl ether, 1,3-bis(3-glycidoxypropyl)tetramethyldisiloxane, and combinations thereof.

The polyhydroxyethers are synthesized by reacting the dihydroxy-containing dye and diglycidyl ether in a solvent system and in the presence of a catalyst at elevated temperature. The monomers are preferably provided at levels such that the molar ratio of dihydroxy-containing dye to diglycidyl ether is from about 10:90 to 90:10, more preferably from about 30:70 to about 70:30, and even more preferably from about 40:60 to about 60:40.

Suitable catalysts for use during polymerization include those selected from the group consisting of ethyltriphenylphosphorium bromide and tetramethylammonium hydroxide. The amount of catalyst typically present is from about 1% to about 5% by weight, and preferably from about 2% to about 3% by weight catalyst, based upon the total weight of the monomer solids taken as 100% by weight.

Suitable solvents for use in the polymerization system include those selected from the group consisting of cyclopentanone, cyclohexanone, gamma butyrolactone (GBL), tetrahydrofurfuryl alcohol, benzyl alcohol, dimethyl sulfoxide (DMSO), n-methyl-2-pyrrolidone (NMP), and mixtures thereof. The solvent is typically present during polymerization at levels of from about 40% to about 90% by weight, and preferably from about 50% to about 80% by weight solvent, based upon the total weight of the composition taken as 100% by weight, with the solids being the remainder.

The polymerization reaction is carried out at a temperature of from about 70° C. to about 150° C., and more preferably from about 130° C. to about 150° C., for a time period of from about 3 hours to about 24 hours, more preferably from about 6 hours to about 15 hours, and even more preferably for about 12 hours. The crude product is precipitated in an alcohol and dried under vacuum. The resulting polyhydroxyether preferably has a weight average molecular weight of from about 1,000 Daltons to about 100,000 Daltons, preferably from about 10,000 Daltons to about 50,000 Daltons, and more preferably from about 20,000 Daltons to about 40,000 Daltons.

2. Polyhydroxyether Compositions

The bonding or build-up compositions for use in the invention are formed by simply dissolving the polyhydroxyether in a solvent system. Suitable solvents include those selected from the group consisting of cyclopentanone, cyclohexanone, gamma butyrolactone (GBL), tetrahydrofurfuryl alcohol, benzyl alcohol, dimethyl sulfoxide (DMSO), n-methyl-2-pyrrolidone (NMP), and mixtures thereof. Preferably, dissolution is allowed to take place over the course of about 24 hours, while stirring, resulting in a homogeneous solution. The solution is preferably filtered before use.

The final laser-releasable bonding or build-up compositions preferably comprise from about 5% to about 50% by weight solids, more preferably from about 10% to about 40% by weight solids, and even more preferably from about 20% to about 30% by weight solids, based upon the total weight of the composition taken as 100% by weight. These solids are usually 100% by weight polyhydroxyether, however, in some instances, they may be from about 95% to about 100% by weight polyhydroxyether, and more preferably from about 98% to about 100% by weight polyhydroxyether, based upon the total weight of solids in the composition taken as 100% by weight.

In one embodiment, the composition is essentially free of crosslinking agents. That is, the composition comprises less than about 3% by weight, preferably less than 1% by weight, and even more preferably about 0% by weight crosslinking agent, based upon the total weight of the composition taken as 100% by weight.

In one embodiment, the composition may include a surfactant. In another embodiment, no other ingredients are included. That is, the composition consists essentially of, or even consists of, the polyhydroxyether in the solvent system. In another embodiment, the composition consists essentially of, or even consists of, the polyhydroxyether and surfactant in the solvent system.

Regardless of the exact formulation, the laser-releasable composition can be used as a bonding composition in a temporary bonding process to bond a device substrate to a carrier substrate using the processes described below. Additionally, the laser-releasable composition can be used as a build-up composition in a redistribution layer formation process, as also described below.

Methods of Using Temporary Bonding or Build-Up Compositions

1. Temporary Bonding Embodiment

Figure 1:
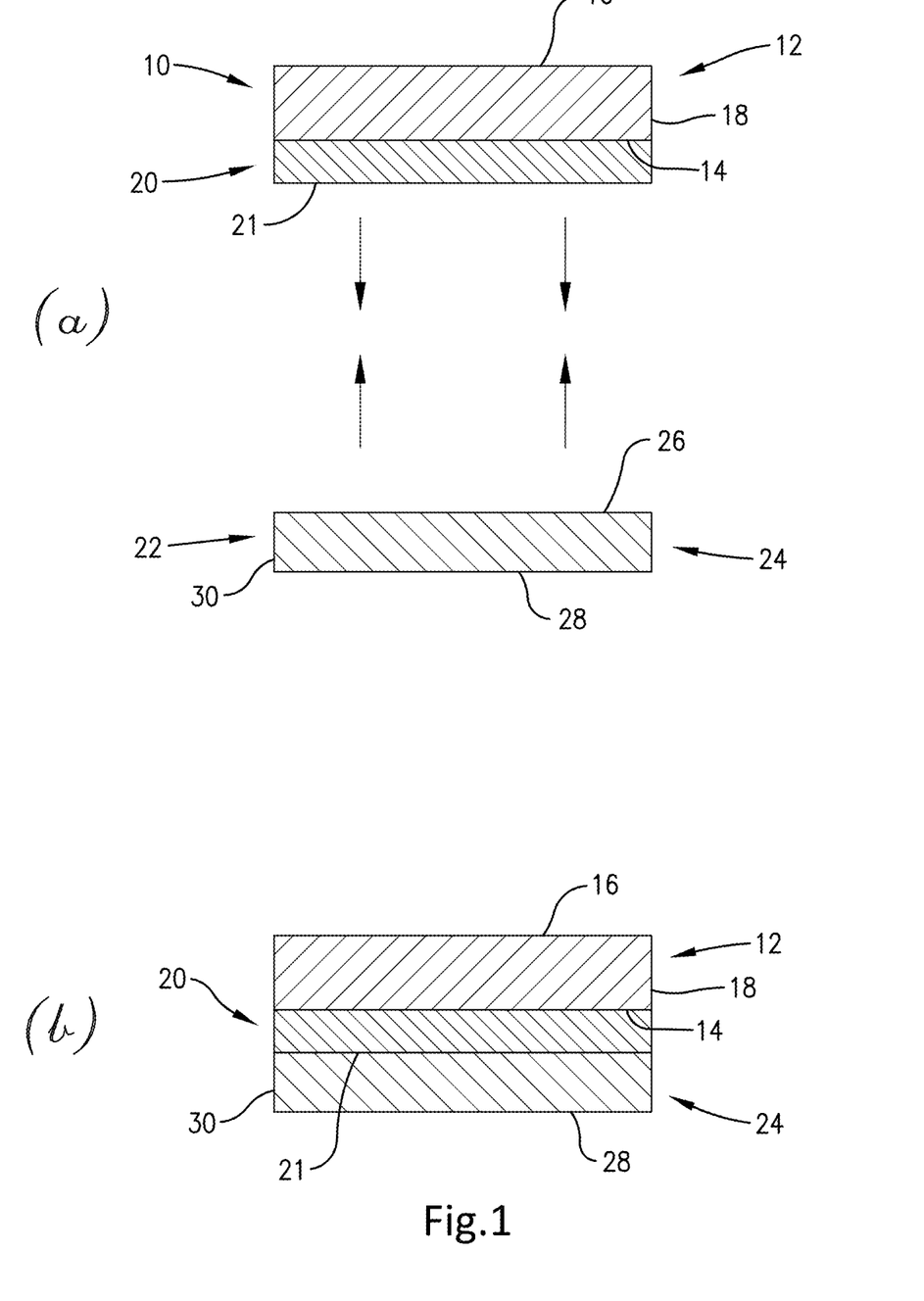
FIG. 1 is a cross-sectional view of a schematic drawing showing a preferred temporary bonding process according to the invention.

Referring to FIG. 1(a) (not to scale), a precursor structure 10 is depicted in a schematic and cross-sectional view. Structure 10 includes a first substrate 12. Substrate 12 has a front or device surface 14, a back surface 16, and an outermost edge 18. Although substrate 12 can be of any shape, it would typically be circular in shape. Preferred first substrates 12 include device wafers such as those whose device surfaces comprise arrays of devices (not shown) selected from the group consisting of integrated circuits, MEMS, microsensors, power semiconductors, light-emitting diodes, photonic circuits, interposers, embedded passive devices, and other microdevices fabricated on or from silicon and other semiconducting materials such as silicon-germanium, gallium arsenide, gallium nitride, aluminum gallium arsenide, aluminum indium gallium phosphide, and indium gallium phosphide. The surfaces of these devices commonly comprise structures (again, not shown) formed from one or more of the following materials: silicon, polysilicon, silicon dioxide, silicon (oxy)nitride, metals (e.g., copper, aluminum, gold, tungsten, tantalum), low k dielectrics, polymer dielectrics, and various metal nitrides and silicides. The device surface 14 can also include at least one structure selected from the group consisting of: solder bumps; metal posts; metal pillars; and structures formed from a material selected from the group consisting of silicon, polysilicon, silicon dioxide, silicon (oxy)nitride, metal, low k dielectrics, polymer dielectrics, metal nitrides, and metal silicides.

A laser-releasable bonding composition according to the invention is applied to the first substrate 12 to form a laser-releasable bonding layer 20 on the device surface 14, as shown in FIG. 1(a). Bonding layer 20 has an upper surface 21 remote from first substrate 12, and preferably, the bonding layer 20 is formed directly on the device surface 14 (i.e., without any intermediate layers between the bonding layer 20 and substrate 12). The bonding composition can be applied by any known application method. One preferred method involves spin-coating the composition at speeds of from about 500 rpm to about 3,000 rpm (preferably from about 1,000 rpm to about 2,000 rpm) for a time period of from about 10 seconds to about 120 seconds (preferably from about 30 seconds to about 90 seconds).

After the composition is applied, it is preferably heated to a temperature of from about 120° C. to about 250° C., and more preferably from about 150° C. to about 200° C., and for time periods of from about 60 seconds to about 10 minutes (preferably from about 120 seconds to about 5 minutes). Importantly, little to no crosslinking takes place during this heating. In other words, the resulting bonding layer 20 is preferably thermoplastic.

In some embodiments, it is preferable to subject the bonding layer 20 to a multi-stage bake process, depending upon the composition utilized. Also, in some instances, the above application and bake process can be repeated on a further aliquot of the composition, so that the bonding layer 20 is "built" on the first substrate 12 in multiple steps.

In a further embodiment, a laser-releasable bonding composition according to the invention can be formed into a preformed, dry film rather than applied as a flowable composition. In this instance, the composition is formed into an unsupported, self-sustaining film that doesn't collapse or change shape (absent application of force or energy) even though it is unsupported. This film can then be adhered to the first substrate 12 to form laser releasable bonding composition 20 shown in FIG. 1(a).

Regardless of how the bonding layer 20 is formed, it should have an average thickness (measured at five locations) of from about 1 µm to about 100 µm, more preferably from about 5 µm to about 50 µm, and even more preferably from about 1 µm to about 30 µm. Thicknesses as used herein can be measured using any film thickness measurement tool, with one preferred tool being an infrared interferometer, such as those sold by SUSS Microtec or Foothill.

The bonding layer 20 should also have a low total thickness variation ("TTV"), meaning that the thickest and thinnest points of the layer 20 are not dramatically different from one another. TTV is preferably calculated by measuring the thickness at a number of points or locations on the film, preferably at least about 50 points or at about 50 points, more preferably at least about 100 points or at about 100 points, and even more preferably at least about 1,000 points or at about 1,000 points. The difference between the highest and lowest thickness measurements obtained at these points is designated the TTV measurement for that particular layer. In some TTV measurement instances, edge exclusion or outliers may be removed from the calculation. In those cases, the number of included measurements is indicated by a percentage, that is, if a TTV is given at 97% inclusion, then 3% of the highest and lowest measurements are excluded, with the 3% split equally between the highest and lowest (i.e., 1.5% each). Preferably, the TTV ranges noted above are achieved using from about 95% to about 100% of the measurements, more preferably from about 97% to about 100% of the measurements, and even more preferably about 100% of the measurements.

In addition to a low TTV in terms of an absolute number (e.g., 5 µm), the TTV relative to the average film thickness of bonding layer 20 should be low. Thus, the bonding layer 20 should have a TTV on a blank substrate of less than about 25% of the average thickness, preferably less than about 10% of the average thickness, and more preferably less than about 5% of the average thickness of the bonding layer 20. For example, if the bonding layer 20 has an average thickness of 50 µm, the maximum acceptable TTV would be about 12.5 µm or lower (less than about 25% of 50 µm), preferably about 5 µm or lower (less than about 10% of 50 µm), and more preferably about 2.5 µm or lower (less than about 5% of 50 µm).

Additionally, laser-releasable bonding layer 20 will form a strong adhesive bond with the desired substrate. Anything with an adhesion strength of greater than about 50 psig, preferably from about 80 psig to about 250 psig, and more preferably from about 100 psig to about 150 psig, as determined by ASTM D4541/D7234, would be desirable for use as bonding layer 20.

The bonding layer 20 will have a k value of at least about 0.008, preferably at least about 0.05, more preferably at least about 0.1, and even more preferably from about 0.1 to about 0.4.

A second precursor structure 22 is also depicted in a schematic and cross-sectional view in FIG. 1(a). Second precursor structure 22 includes a second substrate 24. In this embodiment, second substrate 24 is a carrier wafer. That is, second substrate 24 has a front or carrier surface 26, a back surface 28, and an outermost edge 30. Although second substrate 24 can be of any shape, it would typically be circular in shape and sized similarly to first substrate 12. Preferred second substrates 24 include a clear glass wafer or any other transparent (to laser energy) substrate that will allow the laser energy to pass through the carrier substrate. One especially preferred glass carrier wafer is a Corning® EAGLE XG® glass wafer.

Structures 10 and 22 are then pressed together in a face-to-face relationship, so that upper surface 21 of bonding layer 20 is in contact with front or carrier surface 26 of second substrate 24 (FIG. 1(b)). While pressing, sufficient pressure and heat are applied for a sufficient amount of time so as to effect bonding of the two structures 10 and 22 together to form bonded stack 34. The bonding parameters will vary depending upon the composition from which bonding layer 20 is formed, but typical temperatures during this step will range from about 150° C. to about 250° C., and preferably from about 180° C. to about 220° C., with typical pressures ranging from about 1,000 N to about 25,000 N, and preferably from about 3,000 N to about 20,000 N, for a time period of from about 30 seconds to about 20 minutes, and preferably from about 3 minutes to about 10 minutes.

The bonded stack 34 should have a TTV of less than about 10% of the total average thickness, preferably less than about 5% of the total average thickness (measured at five locations across the stack 34), and even more preferably less than about 3% of the total average thickness of the bonded stack 34. That is, if the bonded stack 34 has an average thickness of 100 µm, TTV of less than about 10% would be about 10 µm or lower.

The first substrate 12 can now be safely handled and subjected to further processing that might otherwise have damaged first substrate 12 if not bonded to second substrate 24. Thus, the structure can safely be subjected to backside processing such as back-grinding, chemical-mechanical polishing ("CMP"), etching, metal deposition (i.e., metallization), dielectric deposition, patterning (e.g., photolithography, via etching), passivation, annealing, redistribution layer formation, and combinations thereof, without separation of substrates 12 and 24 occurring, and without infiltration of any chemistries encountered during these subsequent processing steps. Not only can bonding layer 20 survive these processes, it can also survive processing temperatures up to about 300° C., preferably from about 150° C. to about 280° C., and more preferably from about 180° C. to about 250° C.

Once processing is complete, the substrates 12 and 24 can be separated by using a laser to decompose or ablate all or part of the laser-releasable bonding layer 20. Suitable lasers include UV lasers, preferably at wavelengths of from about 200 nm to about 400 nm, and preferably from about 300 nm to about 360 nm. In order to debond the laser-releasable bonding layer, a laser is scanned across the surface of the carrier wafer in a snake-like pattern in order to expose the entire wafer. Exemplary laser debonding tools include the SUSS MicroTec Lambda STEEL 2000 laser debonder, EVG850 DB Automated Debonding System, and Kingyoup LD-Automatic 200/300 laser debonder. The wafer is preferably scanned by the laser spot with a field size from about 40×40 µm to about 12.5×4 mm. Suitable fluence to debond the substrates is from about 100 mJ/cm$^2$ to about 400 mJ/cm$^2$, and preferably from about 150 mJ/cm$^2$ to about 350 mJ/cm$^2$. Suitable power to debond the substrates are from about 2 W to about 6 W, and preferably from about 3 W to about 4 W.

After laser exposure, the substrates 12 and 24 will readily separate. After separation, any remaining bonding layer 20 can be removed with a plasma etch or a solvent capable of dissolving the bonding layer 20.

In the above embodiments, laser-releasable bonding layer 20 is shown on a first substrate 12 that is a device wafer. It will be appreciated that this substrate/layer scheme could be reversed. That is, bonding layer 20 could be formed on second substrate 24 (i.e., the carrier wafer). The same compositions and processing conditions would apply to this embodiment as those described above.

In a particularly preferred embodiment, bonding layer 20 is the only layer between substrates 12 and 24, as shown in FIG. 1. However, it will be appreciated that in alternative embodiments, bonding layer 20 could be used with additional bonding materials, structural support layers, lamination aid layers, tie layers (for adhesion to initial substrate), contamination control layers, and cleaning layers. Preferred structures and application techniques will be dictated by application and process flow.

Figure 2:
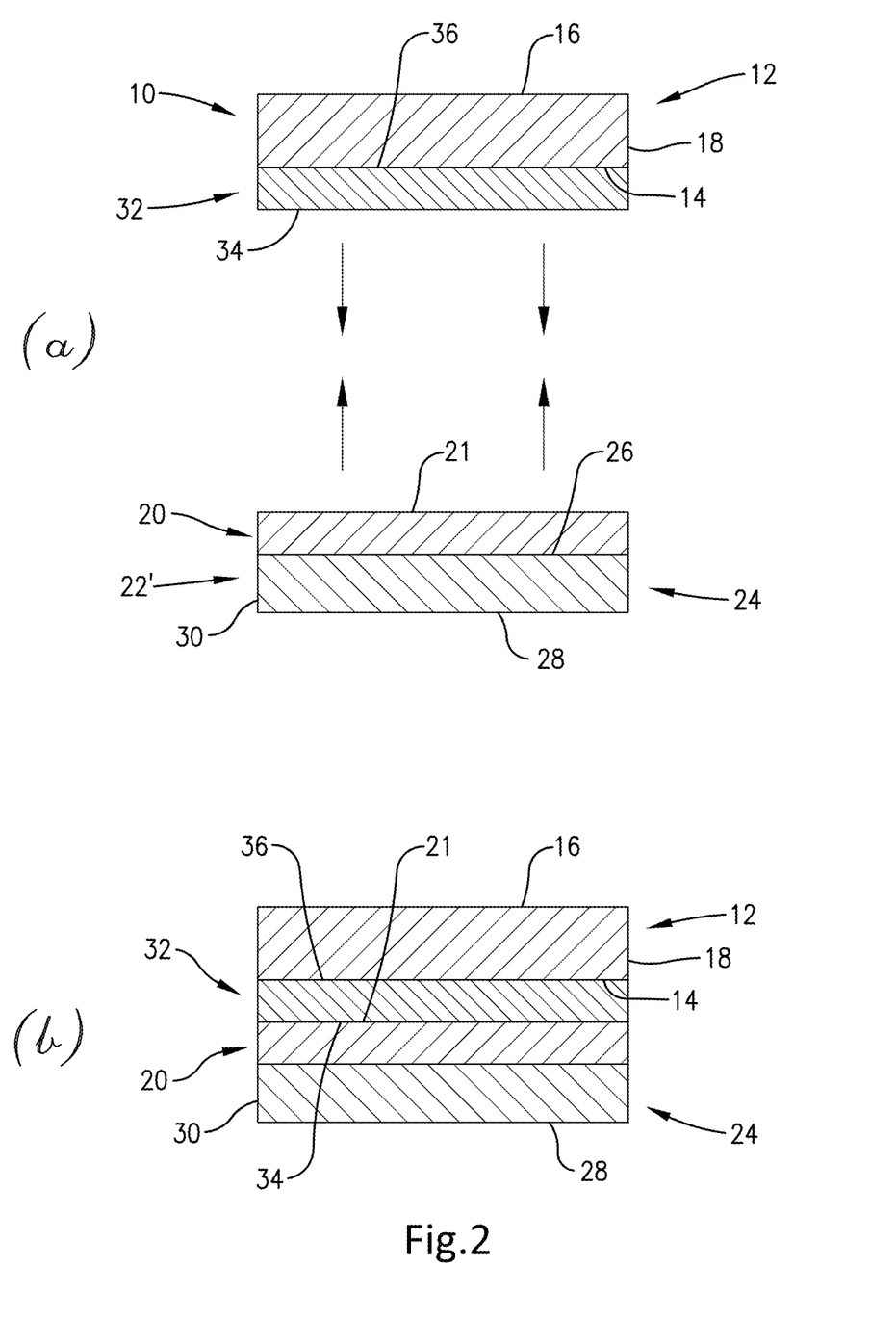
FIG. 2 is a cross-sectional view of a schematic drawing showing a variation to the embodiment of FIG. 1.

An example of this alternative, multi-layer embodiment is shown in FIG. 2, where numbering identical to that of FIG. 1 represents identical parts. In the FIG. 2 embodiment, the inventive bonding composition is applied to the second substrate 24 to form the bonding layer 20 on the carrier surface 26, forming structure 22', as shown in FIG. 2(a). Alternatively, structure 22' can be provided already formed. A second composition, different from the inventive bonding composition used to form laser releasable bonding layer 20, is applied to the device surface 14 of first substrate 12 to form layer 32. Layer 32 has an upper surface 34 remote from first substrate 12, and a lower surface 36 adjacent first substrate 12. In one embodiment, layer 32 is a second bonding layer for use in instances where a multilayer bonding scheme is desirable. In such instances, it is preferred that the adhesion strength of second bonding layer 32 be greater (stronger) than the adhesion strength of laser-releasable bonding layer 20. In particular, the adhesion strength of second bonding layer 32 is at least about 1.2 times, preferably at least about 1.5 times, and more preferably from about 1.7 to about 4 times the adhesion strength of laser-releasable bonding layer 20. Separation of the first and second substrates 12, 24 would be carried out as described previously.

Alternatively, this substrate/layer scheme could be reversed in a multi-layer scheme. That is, layer 32 could be formed on second substrate 24 (the carrier wafer) while the inventive laser-releasable bonding layer 20 is formed on first substrate 12 (the device wafer). In this instance, layer 32 (regardless of whether it is a bonding layer) would be selected so that laser energy could pass through it, after passing through second substrate 24, thus allowing the laser energy to make contact with laser-releasable bonding layer 20 and causing decomposition, as described previously.

2. Build-Up Layer Embodiment

In a further embodiment, the inventive laser-releasable compositions can be used as a build-up layer for redistribution layer ("RDL") formation, and particularly in RDL-first/chip-last packaging in wafer- or panel-level processes, which is good for minimizing or even avoiding known-good die loss during packaging. A schematic of one such process is shown in FIG. 3.

Figure 3:
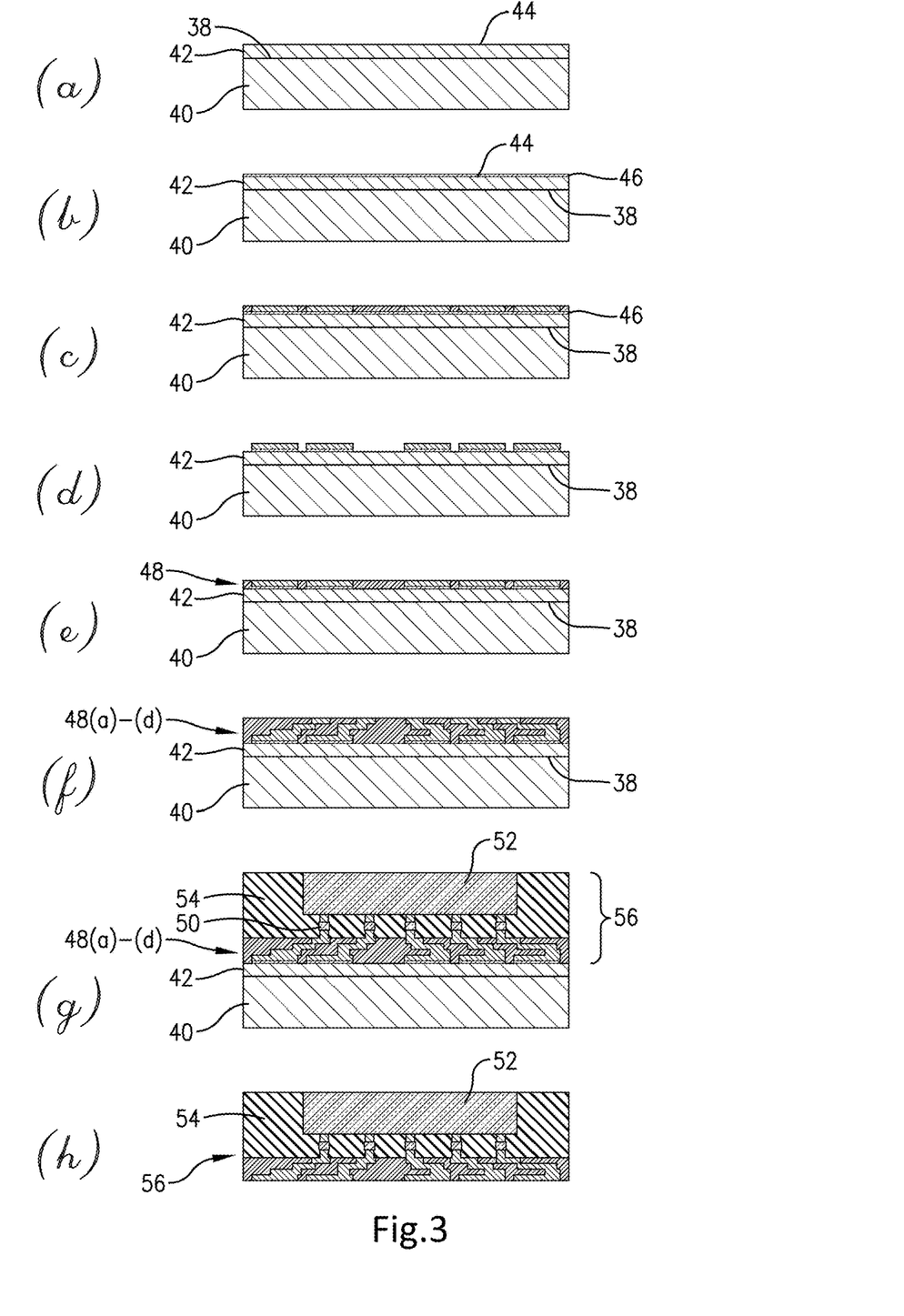
FIG. 3 is a schematic drawing showing redistribution layer formation according to the invention.

A laser-releasable bonding or build-up composition as described previously is applied to the upper surface 38 of a carrier substrate 40 to form a laser-releasable build-up layer 42 on the carrier surface 38, as shown in FIG. 3(a). Build-up layer 42 is formed following any of the methods described with respect to the temporary bonding embodiment above, including the processing conditions and resulting properties. Build-up layer 42 has an upper surface 44 remote from carrier substrate 40, and preferably the build-up layer 42 is formed directly on the upper surface 38 of carrier substrate 40 (i.e., without any intermediate layers between the build-up layer 42 and substrate 40).

Next, a seed layer 46 is deposited on upper surface 44 following conventional methods (FIG. 3(b)). The seed layer 46 can then be coated with a photoresist, patterned, and electroplated, again following known methods, forming the structure shown in FIG. 3(c). Referring to FIG. 3(d), the photoresist is stripped and the metal etched, followed by coating, patterning, and curing of a dielectric layer. This results in the formation of the first RDL 48, as shown in FIG. 3(e). The steps of FIG. 3(b) to FIG. 3(e) can be repeated multiple times, as needed, to create multiple RDLs (48(a)-(d), i.e., four RDLs, in the embodiment shown in FIG. 3(f)).

Referring to FIG. 3(g), after the desired number of RDLs have been formed, solder balls 50 are attached to the uppermost (last formed) RDL, again following conventional methods. A die 52 is bonded to solder balls 50, followed by application and grinding of a conventional epoxy molding layer 54, forming a fan-out wafer level package structure 56. Finally, laser energy is applied to the carrier substrate 40, following previously described laser separation conditions, so as to decompose or ablate all or part of the laser-releasable build-up layer 42. After laser application, the carrier substrate 40 will be released and separated from fan-out wafer level package structure 56 (FIG. 3(*h*)), with any remaining build-up layer 42 being removed by a solvent.

It should be noted that the above-described process for forming fan-out wafer level package structures is only one example of this type of process that can be carried out using the inventive composition as a build-up layer, and that variations of this process can and will be made, depending upon user needs. For example, the number of RDL layers can be varied, as needed, as well as the number and positioning of solder balls and dies. These arrangements will be understood and customized by one skilled in this art.

Additional advantages of the various embodiments of the invention will be apparent to those skilled in the art upon review of the disclosure herein and the working examples below. It will be appreciated that the various embodiments described herein are not necessarily mutually exclusive unless otherwise indicated herein. For example, a feature described or depicted in one embodiment may also be included in other embodiments, but is not necessarily included. Thus, the present invention encompasses a variety of combinations and/or integrations of the specific embodiments described herein.

As used herein, the phrase "and/or," when used in a list of two or more items, means that any one of the listed items can be employed by itself or any combination of two or more of the listed items can be employed. For example, if a composition is described as containing or excluding components A, B, and/or C, the composition can contain or exclude A alone; B alone; C alone; A and B in combination; A and C in combination; B and C in combination; or A, B, and C in combination.

The present description also uses numerical ranges to quantify certain parameters relating to various embodiments of the invention. It should be understood that when numerical ranges are provided, such ranges are to be construed as providing literal support for claim limitations that only recite the lower value of the range as well as claim limitations that only recite the upper value of the range. For example, a disclosed numerical range of about 10 to about 100 provides literal support for a claim reciting "greater than about 10" (with no upper bounds) and a claim reciting "less than about 100" (with no lower bounds).

EXAMPLES

The following examples set forth methods in accordance with the invention. It is to be understood, however, that these examples are provided by way of illustration and nothing therein should be taken as a limitation upon the overall scope of the invention.

Example 1

Polymer 1 for Laser Debond

In this procedure, 13.07 grams of 4,4'-dihydroxybenzophenone (TCI America, Portland, Oreg.), 20.76 grams of bisphenol A diglycidyl ether (D.E.R.™ 332, Sigma-Aldrich, St. Louis, Mo.), and 0.84 gram of ethyltriphenylphosphorium bromide (Sigma-Aldrich, St. Louis, Mo.) were dissolved in 65.33 grams of cyclopentanone (Sigma-Aldrich, St. Louis, Mo.) in a three-necked round-bottom flask. The mixture was reacted at 140° C. for 12 hours. The resulting Polymer 1 was precipitated into 1,000 grams of ethanol (Sigma-Aldrich, St. Louis, Mo.), followed by drying under vacuum at 80° C. overnight.

Next, 30 grams of the purified Polymer 1 were dissolved in 70 grams of cyclopentanone and stirred for one day, resulting in a homogeneous solution. The resulting Formulation 1 was filtered through a 0.2-µm Messiner filter.

The reaction taking place in this Example is as follows:

Example 2

Properties of Polymer 1

Figure 4:
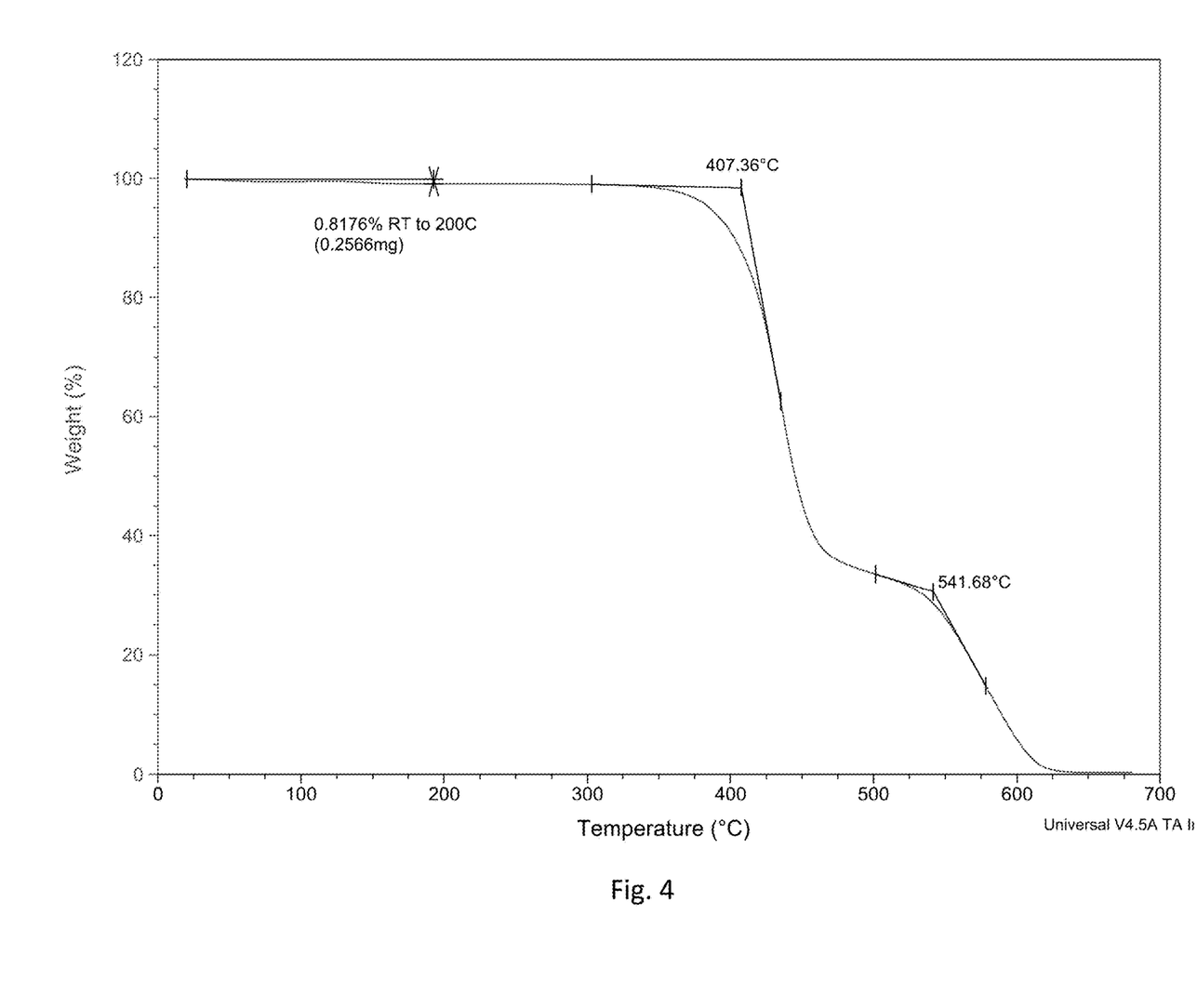
FIG. 4 is a graph depicting the TGA (in air) of Polymer 1, as tested in Example 2.
Figure 5:
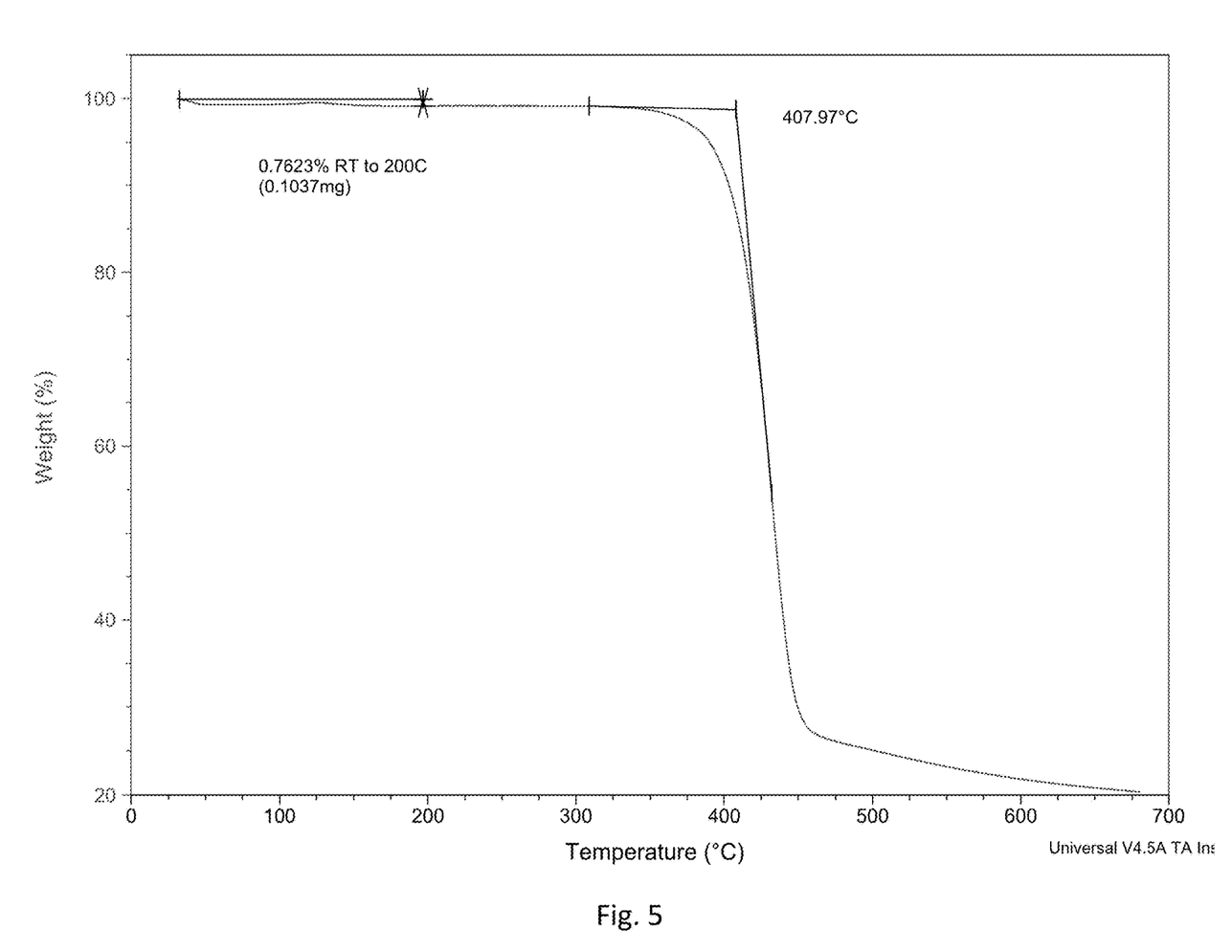
FIG. 5 is a graph depicting the TGA (in nitrogen) of Polymer 1, as tested in Example 2.

Thermogravimetric analysis (TGA) was performed at 10° C./min ramp in both air and nitrogen. The results are shown in FIGS. 4 and 5. The polymer exhibited relatively high initial decomposition temperatures of around 350° C. in air and 360° C. in nitrogen.

Polymer 1 was fully characterized, and that characterization data are shown in Table 1. The weight average molecular weight (Mw) and polydispersity ("PDI") were measured by using gel permeation chromatography (GPC) using THF as an elution solvent. The glass transition temperature ($T_g$) was detected with differential scanning calorimetry (DSC) under a nitrogen environment from 25° C. to 250° C. The material was tested for rheological properties (including melt viscosity) using a rheometer from TA Instruments. The sample was loaded at 250° C., and the rheological properties were recorded from 250° C. to 50° C.

TABLE 1

Characterization of Polymer 1

| $T_g$ | Mw | PDI | Melt viscosity |
|---|---|---|---|
| 100° C. | 39,956 | 2.12 | 1517 Pa · s at 200° C. |

The rheology data demonstrated that the Polymer 1 material could be used with a thermal compression bonding process to get a good bond line around 200° C. due to its low melt viscosity at this temperature.

Example 3

Optical Testing of Polymer 1

Optical constants (n & k) for Polymer 1 were determined using a variable angle spectroscopic ellipsometer (VASE). Table 2 shows the optical constants, n and k, of the sample at two different wavelengths. Polymer 1 exhibited very good absorbance at 308 nm with a k value of 0.2, but not as good at 355 nm with a k value of 0.008. This high k at 308 nm further indicated that Polymer 1 would likely have good laser debonding performance at this wavelength.

TABLE 2

Optical Constants for Polymer 1.

| Wavelength | k | n |
|---|---|---|
| 308 nm | 0.2 | 1.84 |
| 355 nm | 0.008 | 1.74 |

Example 4

Bonding Using Formulation 1

Figure 6:
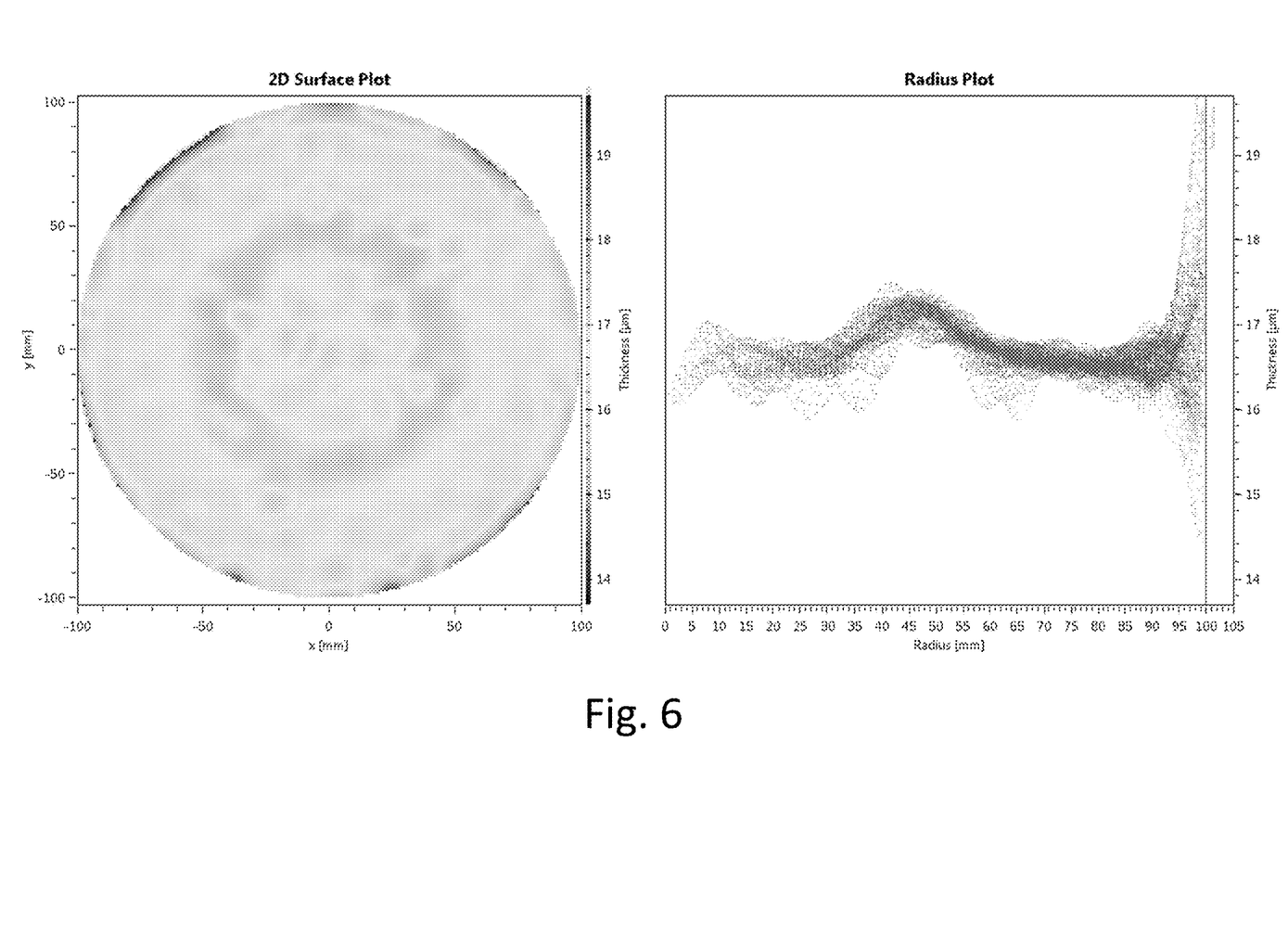
FIG. 6 are SUSS Chrocdail images of the bond line created by Formulation 1, as tested in Example 4.

In this Example, 16 μm of Formulation 1 of Example 1 was coated on an eight-inch glass wafer as a carrier wafer. This coating was accomplished by spin coating at 1,000 rpm with an acceleration of 3,000 rpm/s for 30 seconds. The carrier wafer was then baked at 50° C. for 3 minutes, 120° C. for 3 minutes, and 200° C. for 3 minutes. The coated carrier wafer was bonded to an eight-inch Si wafer by bonding at 230° C., 2000 N for 3 minutes under vacuum (<5 mbar) in an EVG® 510 bonding system (EV Group). The bonded pair was scanned with a Chrocdail IR interferometer (SUSS MicroTec SE), which uses a Precitec sensor and measures a spinning substrate and is capable of measuring hundreds, or even thousands, of points on a wafer surface. No voids were detected (see FIG. 6), and the material showed a good bond line (16.7 μm thickness) with minimal total thickness variation ("TTV") of 1.72 μm using 97% of the measurements.

Example 5

Wafer Thinning Using Formulation 1

Six bonded wafer pairs prepared as described in Example 4 were subjected to a grind thinning test using a grinder/polisher (DGP8761, Disco Corporation) with a target thickness of 60 μm. The wafers were coarsely ground to 90 μm with a removal rate of 1 μm/s~5 μm/s, then ground further to 62 μm with a removal rate of 0.2 μm/s~0.4 μm/s. The wafers were then polished to thin them another 2 μm with a removal rate of 1 μm/min to achieve the 60-μm final target thickness. Table 3 shows the detailed data of the six wafer pairs. The thickness and TTV of the bond line were consistent with the numbers before grinding, indicating the mechanical stability of the bonding material during the grinding process. The thinned Si wafers also achieved the target thickness with good TTV. In addition, a thermal simulation was performed on the thinned wafer pairs by baking them in a nitrogen oven at 250° C. for 30 minutes. No severe defects were observed for any of the wafers.

TABLE 3

Bonded Wafer Pairs Before and After Grinding

| After Bond | | | After Grinding | | | |
|---|---|---|---|---|---|---|
| Post-Bond Adhesive Thx (μm) | Bond-line TTV (97%) (μm) | Bow (μm) | Bond-line Thx (μm) | Bond-line TTV (97%) (μm) | Thin Si Thx (μm) | Thin Si TTV (97%) (μm) |
| 16.37 | 1.77 | 354.5 | 16.39 | 1.86 | 65.61 | 6.01 |
| 16.19 | 2.12 | 91 | 16.19 | 1.85 | 63.67 | 5.63 |
| 16.24 | 2.22 | 57 | 16.29 | 2.07 | 67.93 | 6.03 |
| 16.70 | 1.72 | 47 | 16.77 | 1.28 | 67.62 | 6.79 |
| 16.81 | 1.55 | 119.5 | 16.82 | 1.54 | 59.55 | 4.97 |
| 16.98 | 2.27 | 105 | 17 | 2.3 | 58.17 | 4.74 |

Example 6

Laser Debonding and Cleaning Using Formulation 1

Figure 7:
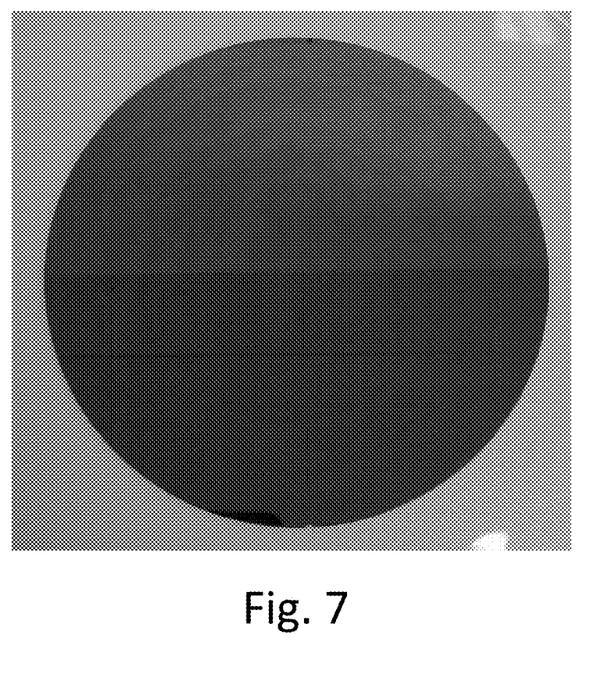
FIG. 7 is a blank device debonded at 308 nm as described in Example 6.

The bonded wafer pairs were successfully debonded by using the three major UV-laser wavelengths in market, a SUSS ELD12 Laser Debonder, an EVG Semi-Automatic Debonding System, and a Kingyoup LD-Semi Automatic 200/300. The laser debonding parameters for each of the three debonders are listed in Table 4. An image of a debonded device wafer is shown in FIG. 7. Any residue remaining on the device wafer was cleaned very well using cyclopentanone. After cleaning, the wafer was visually clean under green light with no residue.

TABLE 4

Laser Debonding Parameters

| SUSS | EVG | Kingyoup |
|---|---|---|
| 220 mJ/cm², with beam size of 12.5 × 4 mm and overlapping of 100~200 μm. | 1000 mJ/cm², with beam size of 40 × 40 μm and pitch size of 40 μm. | 6 W, with beam size of 60 μm and pitch size of 54 μm. |

Example 7

Polymer 2 for Laser Debond

In this Example, 17.71 grams of 4,4'-dihydroxybenzophenone, 30.94 grams of bisphenol A diglycidyl ether (D.E.R.™ 332), and 1.35 grams of ethyltriphenylphosphorium bromide were dissolved in 50 grams of cyclohexanone (Sigma-Aldrich, St. Louis, Mo.) in a three-necked round-bottom flask. The mixture was reacted at 150° C. for 24 hours.

Next, 57.34 grams of the polymer were dissolved in 42.66 grams of gamma-butyrolactone and stirred for one day, resulting in a homogeneous solution. The resulting Formulation 2 was filtered through a 0.2-μm Messiner filter.

Example 8

Bonding Using Formulation 2

In this procedure, 21 μm of Formulation 2 from Example 7 was coated on an eight-inch glass wafer as carrier wafer by spin coating at 1,000 rpm with an acceleration of 3,000 rpm/s for 30 seconds. The carrier wafer was then baked at 50° C. for 4 min, 110° C. for 4 min, 200° C. for 4 min, and finally 220° C. for 4 min. The coated carrier wafer was bonded to an eight-inch Si wafer. The wafer pair was bonded at 210° C., 2,000 N for 4 minutes under vacuum (<5 mbar) in an EVG® 510 bonder. Good bond line formation was confirmed with visual inspection.

Example 9

Creation of Dry Film from Formulation 2

A bar coater (K303 Multicoater, RK PrintCoat Instruments Ltd, United Kingdom) was used to cast the laser-sensitive, thermoplastic Formulation 2 onto a 50-μm polyethylene terephthalate carrier film (H950A, Nan Ya Plastics Corporation, Taiwan) under the following conditions: gap of 80 μm and speed of 4 meters per minute. The solvent-cast film was dried in hot plate at 50° C. for 5 minutes then 140° C. for 5 minutes to obtain a free-standing, dry, bonding film of dimension 20 μm in thickness, 200 mm in width, and 300 mm in length.

Example 10

Lamination of Dry Film

The bonding film created in Example 9 was laminated onto a 100-mm glass wafer using a Tamerica, TCC-2700 hot roll laminator under following conditions: roller temp of 140° C. and speed of 0.2 meters per minute. The excess film was trimmed with a knife, and the base polyethylene terephthalate film was peeled off after lamination.

Example 11

Bonding of Laminated Glass Wafer

The laminated glass wafer prepared in Example 10 was bonded with another 100-mm glass wafer using a Cee® Apogee™ bonder (Cost Effective Equipment, LLC, Rolla Mo.) under following conditions: platen temp 230° C. and force 1,800 N for 3 minutes. No voids or delamination were observed after the wafer-to-wafer bonding.

Example 12

Laser Release and Cleaning of Bonded Wafer Pair

After processing, the bonded glass wafer pair was separated using a 355-nm laser debonder (LD-Semi Automatic 300, Kingyoup Enterprises Co., Ltd.) under the following conditions: power 6 W, scan speed 2 m/s, and line pitch 40-μm. After debonding, both glass wafers were spin-cleaned with a GBL-cyclohexanone co-solvent system for reuse and further processing.

We claim:

1. A temporary bonding method comprising:
   providing a stack comprising:
      a first substrate having a back surface and a front surface;
      a bonding layer adjacent said front surface and comprising a polyhydroxyether; and
      a second substrate having a first surface adjacent said bonding layer, said bonding layer being the only layer between said first and second substrates; and
   exposing said bonding layer to UV laser energy so as to facilitate separation of said first and second substrates.

2. The method of claim 1, wherein said polyhydroxyether comprises a copolymer of a diglycidyl ether and a dihydroxy dye.

3. The method of claim 2, wherein said diglycidyl ether is selected from the group consisting of bisphenol A diglycidyl ether, bisphenol F diglycidyl ether, 1,4-cyclohexanedimethanol diglycidyl ether, resorcinol diglycidyl ether, bisphenol A propoxylate diglycidyl ether, ethylene glycol diglycidyl ether, 1,4-cyclohexandimethanol diglycidyl ether, glycerol diglycidyl ether, 1,4-butanediol diglycidyl ether, neopentyl glycol diglycidyl ether, 1,3-butanediol diglycidyl ether, 1,3-bis(3-glycidoxypropyl)tetramethyldisiloxane, and combinations thereof.

4. The method of claim 2, wherein said dihydroxy dye is selected from the group consisting of 4,4'-dihydroxybenzophenone, dihydroxy chalcone dyes, 4-[(2-phenylhydrazono)methyl]resorcinol, dihydroxyazobenzene, dihydroxyanthraquinone, 2,2'-methylenebis[6-(benzotriazol-2-yl)-4-tert-octylphenol], curcumin, curcumin derivatives, and combinations thereof.

5. The method of claim 1, wherein said bonding layer is a thermoplastic layer.

6. The method of claim 1, wherein said exposing is carried out at a dosage of from about 200 mJ/cm² to about 400 mJ/cm².

7. The method of claim 1, wherein said providing a stack comprises forming said bonding layer on said front surface.

8. The method of claim 7, wherein said forming comprises applying a flowable bonding composition to said front surface, said flowable composition comprising a polyhydroxyether dispersed or dissolved in a solvent system.

9. The method of claim 8, further comprising heating said composition at a temperature of from about 120° C. to about 250° C. for a time period of from about 60 seconds to about 10 minutes to form said bonding layer.

10. The method of claim 7, wherein said forming comprises applying a free-standing film comprising polyhydroxyether to said front surface to form said bonding layer.

11. The method of claim 10, wherein said applying comprises adhering said free-standing film to said front surface.

12. The method of claim 1, wherein one of said front surface and said first surface is selected from the group consisting of:
(1) a device surface comprising an array of devices selected from the group consisting of integrated circuits; MEMS; microsensors; power semiconductors; light-emitting diodes; photonic circuits; interposers; embedded passive devices; and microdevices fabricated on or from silicon, silicon-germanium, gallium arsenide, and gallium nitride; and
(2) a device surface comprising at least one structure selected from the group consisting of: solder bumps; metal posts; metal pillars; and structures formed from a material selected from the group consisting of silicon, polysilicon, silicon dioxide, silicon (oxy)nitride, metal, low k dielectrics, polymer dielectrics, metal nitrides, and metal silicides.

13. The method of claim 1, wherein one of said first and second substrates comprises glass or other transparent material.

14. The method of claim 1, further comprising subjecting said stack to processing selected from the group consisting of back-grinding, chemical-mechanical polishing, etching, metallizing, dielectric deposition, patterning, passivation, annealing, redistribution layer formation, and combinations thereof, prior to separating said first and second substrates.

15. A method of forming a microelectronic structure, said method comprising:
(I) forming a build-up layer on the surface of a substrate, said build-up layer comprising a polyhydroxyether and having an upper surface that is remote from the surface of said substrate;
(II) forming a first redistribution layer on said upper surface; and
(III) optionally forming one or more additional redistribution layers on said first redistribution layer.

16. The method of claim 15, further comprising:
(IV) attaching a solder ball to the last redistribution layer of forming (II) and optional forming (III);
(V) attaching a die to said solder ball; and
(VI) optionally repeating attaching (IV) and attaching (V) one or more times.

17. The method of claim 16, further comprising forming an epoxy layer over said die and solder ball to form a fan-out wafer level package structure on said substrate.

18. The method of claim 17, further comprising separating said substrate and said fan-out wafer level package structure.

19. The method of claim 18, wherein said separating comprises exposing said build-up layer to laser energy so as to facilitate separation of said substrate and said fan-out wafer level package structure.

20. The method of claim 19, wherein said exposing is carried out at a dosage of from about 200 $mJ/cm^2$ to about 400 $mJ/cm^2$.

21. The method of claim 15, wherein said polyhydroxyether comprises a copolymer of a diglycidyl ether and a dihydroxy dye.

22. The method of claim 21, wherein said diglycidyl ether is selected from the group consisting of bisphenol A diglycidyl ether, bisphenol F diglycidyl ether, 1,4-cyclohexanedimethanol diglycidyl ether, resorcinol diglycidyl ether, bisphenol A propoxylate diglycidyl ether, ethylene glycol diglycidyl ether, 1,4-cyclohexandimethanol diglycidyl ether, glycerol diglycidyl ether, 1,4-butanediol diglycidyl ether, neopentyl glycol diglycidyl ether, 1,3-butanediol diglycidyl ether, 1,3-bis(3-glycidoxypropyl)tetramethyldisiloxane, and combinations thereof.

23. The method of claim 21, wherein said dihydroxy dye is selected from the group consisting of 4,4'-dihydroxybenzophenone, dihydroxy chalcone dyes, 4-[(2-phenylhydrazono)methyl]resorcinol, dihydroxyazobenzene, dihydroxyanthraquinone, 2,2'-methylenebis[6-(benzotriazol-2-yl)-4-tert-octylphenol], curcumin, curcumin derivatives, and combinations thereof.

24. The method of claim 15, wherein said forming (I) comprises applying a flowable composition to the surface of said substrate, said flowable composition comprising said polyhydroxyether dispersed or dissolved in a solvent system.

25. The method of claim 24, further comprising heating said composition at a temperature of from about 120° C. to about 250° C. for a time period of from about 60 seconds to about 10 minutes to form said build-up layer.

26. The method of claim 15, wherein said forming (I) comprises applying a free-standing film comprising said polyhydroxyether to the surface of said substrate to form said build-up layer.

27. The method of claim 26, wherein said applying comprises adhering said free-standing film to the surface of said substrate.

28. The method of claim 15, wherein said substrate comprises glass or other transparent material.

29. The method of claim 15, further comprising:
attaching multiple solder balls to the last redistribution layer of forming (II) and optional forming (III); and
attaching a die to at least two of said multiple solder balls.

30. The method of claim 1, wherein said exposing comprises exposing said bonding layer to energy having a wavelength of from about 200 nm to about 400 nm.

31. The method of claim 1, wherein said bonding layer consists essentially of said polyhydroxyether.

* * * * *